(12) United States Patent
Cheng

(10) Patent No.: US 9,947,807 B2
(45) Date of Patent: Apr. 17, 2018

(54) SOLAR MODULE WITH WIRELESS POWER TRANSFER

(71) Applicant: TSMC Solar Ltd., Taichung (TW)

(72) Inventor: Tzu-Huan Cheng, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 467 days.

(21) Appl. No.: 14/173,841

(22) Filed: Feb. 6, 2014

(65) Prior Publication Data
US 2015/0221785 A1 Aug. 6, 2015

(51) Int. Cl.
| H04B 5/00 | (2006.01) |
| H01L 31/02 | (2006.01) |
| H02J 50/10 | (2016.01) |
| H02J 50/12 | (2016.01) |
| H02J 7/02 | (2016.01) |
| H02J 7/35 | (2006.01) |

(52) U.S. Cl.
CPC ........ H01L 31/02021 (2013.01); H02J 50/10 (2016.02); H02J 50/12 (2016.02); H04B 5/0081 (2013.01); *H02J 7/025* (2013.01); *H02J 7/35* (2013.01); *Y02E 10/50* (2013.01)

(58) Field of Classification Search
CPC .............................. H04B 5/0081; H02J 50/10
USPC ......................................................... 307/104
See application file for complete search history.

(56) References Cited

U.S. PATENT DOCUMENTS

| 5,666,127 A * | 9/1997 | Kochiyama | H01Q 1/288 343/700 MS |
| 6,395,971 B1 * | 5/2002 | Bendel | H01L 31/042 136/244 |
| 8,621,813 B2 * | 1/2014 | Dube | H01L 31/0483 136/252 |
| 8,632,851 B1 * | 1/2014 | Ren | C23C 14/14 427/569 |
| 8,994,224 B2 * | 3/2015 | Mehta | H02J 5/005 307/104 |
| 9,160,203 B2 * | 10/2015 | Fiorello | |
| 9,246,336 B2 * | 1/2016 | Kurs | B60L 11/007 |
| 9,378,446 B2 * | 6/2016 | Sample | G06K 19/0704 |
| 2005/0202589 A1 * | 9/2005 | Basol | H01L 21/02568 438/102 |
| 2008/0055177 A1 * | 3/2008 | Dixon | H01Q 1/22 343/787 |
| 2008/0216886 A1 * | 9/2008 | Iwakura | H01L 31/046 136/244 |
| 2010/0207572 A1 * | 8/2010 | Kirby | H02J 7/025 320/101 |
| 2011/0017282 A1 * | 1/2011 | Tas | H01L 31/042 136/252 |
| 2011/0037322 A1 * | 2/2011 | Kanno | H02J 17/00 307/104 |
| 2011/0220182 A1 * | 9/2011 | Lin | H01L 31/048 136/251 |

(Continued)

FOREIGN PATENT DOCUMENTS

JP 2007317868 A * 12/2007

*Primary Examiner* — Adi Amrany
(74) *Attorney, Agent, or Firm* — Duane Morris LLP (57) ABSTRACT

A solar module includes a solar panel and a wireless power transmission module coupled to the solar panel for transmitting power generated by the solar panel wirelessly.

16 Claims, 6 Drawing Sheets

(56) References Cited

U.S. PATENT DOCUMENTS

| | | | | |
|---|---|---|---|---|
| 2011/0266882 A1* | 11/2011 | Yamamoto | ............ | H02J 17/00 307/104 |
| 2012/0098350 A1* | 4/2012 | Campanella | .......... | B60L 3/0069 307/104 |
| 2013/0009851 A1* | 1/2013 | Danesh | .................. | H01G 9/20 343/904 |
| 2013/0109127 A1* | 5/2013 | Zhu | .................. | H01L 31/1804 438/71 |
| 2013/0255755 A1* | 10/2013 | Chich | ................ | H01L 31/0428 136/251 |
| 2014/0021909 A1* | 1/2014 | Klawon | ............... | H02J 7/0042 320/108 |
| 2015/0101534 A1* | 4/2015 | Pan | ....................... | H01L 31/18 118/708 |
| 2016/0105144 A1* | 4/2016 | Haynes | ............... | H01L 31/048 136/244 |

* cited by examiner

FIG. 8

SOLAR MODULE WITH WIRELESS POWER TRANSFER

BACKGROUND

The present disclosure relates to solar modules and specifically to connectors of solar modules.

Solar modules include a group of solar cells connected in series or parallel with one another. The solar cells are connected to a junction box with a ribbon. The interface between the ribbon and junction box can lead to electrical and mechanical reliability issues, such as from water infiltration and drill holes for ribbon punch-through.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Likewise, terms concerning electrical coupling and the like, such as "coupled," "connected" and "interconnected," refer to a relationship wherein structures communicate with one another either directly or indirectly through intervening structures unless expressly described otherwise.

Figure 1A:
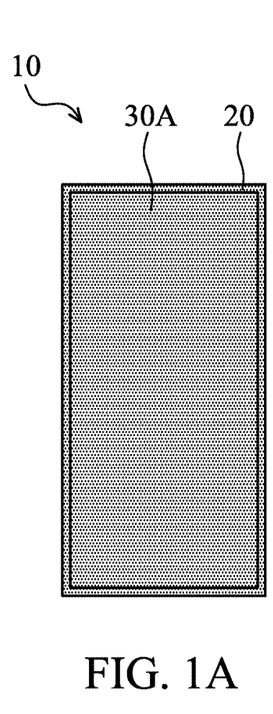
FIGS. 1A and 1B illustrate front and rear views, respectively, of a solar module with junction box and connector.
Figure 1B:
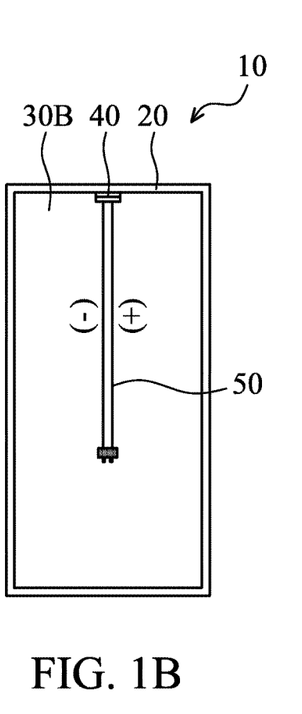

FIGS. 1A and 1B illustrate front and rear views of a solar module 10, respectively. The solar module 10 includes a frame 20 that supports a power generation region 30 that includes a plurality of solar cells connected in series or in parallel. The front surface of this power generation region 30 is designated with the reference 30A and the rear surface is designated with the reference 30B. With reference to FIG. 1B, the rear of the solar module 10 includes a junction box 40 that is connected to a connector 50, which has positive and negative lines. As discussed above, the connection between the junction box 30 and the connector 40 is prone to electrical or mechanical failures.

Figure 2A:
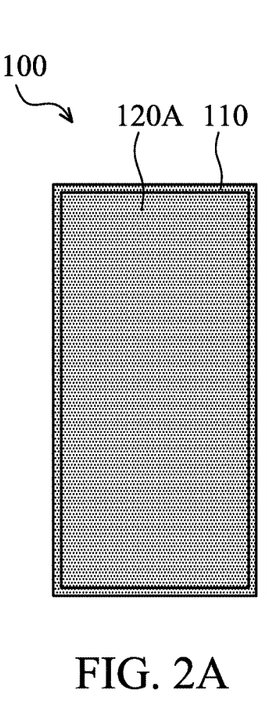
FIGS. 2A and 2B illustrate front and rear views, respectively, of a solar module with a wireless power transmitter, in accordance with some embodiments.
Figure 2B:
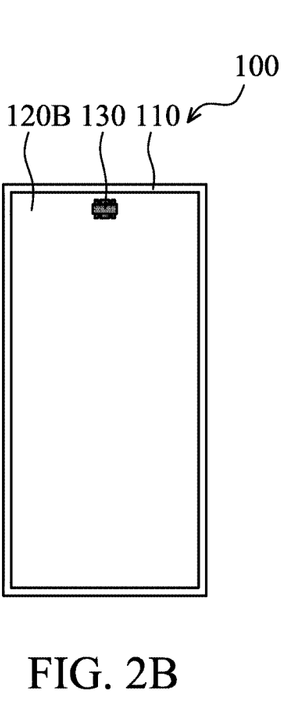

FIGS. 2A and 2B illustrate an embodiment of a solar module 100. The solar module 100 includes a frame 110 that supports a power generation region 120 that includes a plurality of solar cells connected in series or in parallel. The front surface of this power generation region 120 is designated with the reference 120A and the rear surface is designated with the reference 120B. The solar cells may be of any design, such as a silicon solar cell or this film solar cell (e.g., a-Si, Copper indium gallium (di)selenide (CIGS), or CdTe thin film solar cell). Thus far, the solar module 100 is identical to the solar module 10 of FIG. 1.

With reference now to FIG. 2B, the rear of the solar module 100 includes a wireless power transfer region 130 rather than a junction box and connector. This power transfer region connects to the positive and negative outputs of the power generation region (i.e., of the solar panel) and is configured to wirelessly transmit power generated by the power generation region to a reciprocally configured power receiver. In this manner, the solar module 100 does not have mechanical power connections at a junction box that are prone to electrical or mechanical power.

Figure 3:
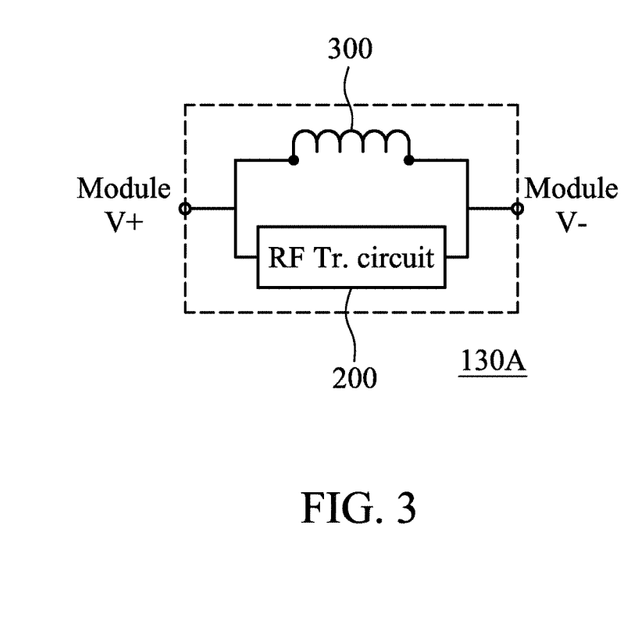
FIG. 3 illustrates a RF power transfer region of a solar module, in accordance with some embodiments.

FIG. 3 illustrates one embodiment of a power transfer region 130A. In this embodiment, power is transferred from the solar module 100 via RF. This embodiment includes an RF circuit 200 coupled between the positive and negative power leads of the solar module 100 and a RF coil 300 coupled to the RF circuit.

Figure 4:
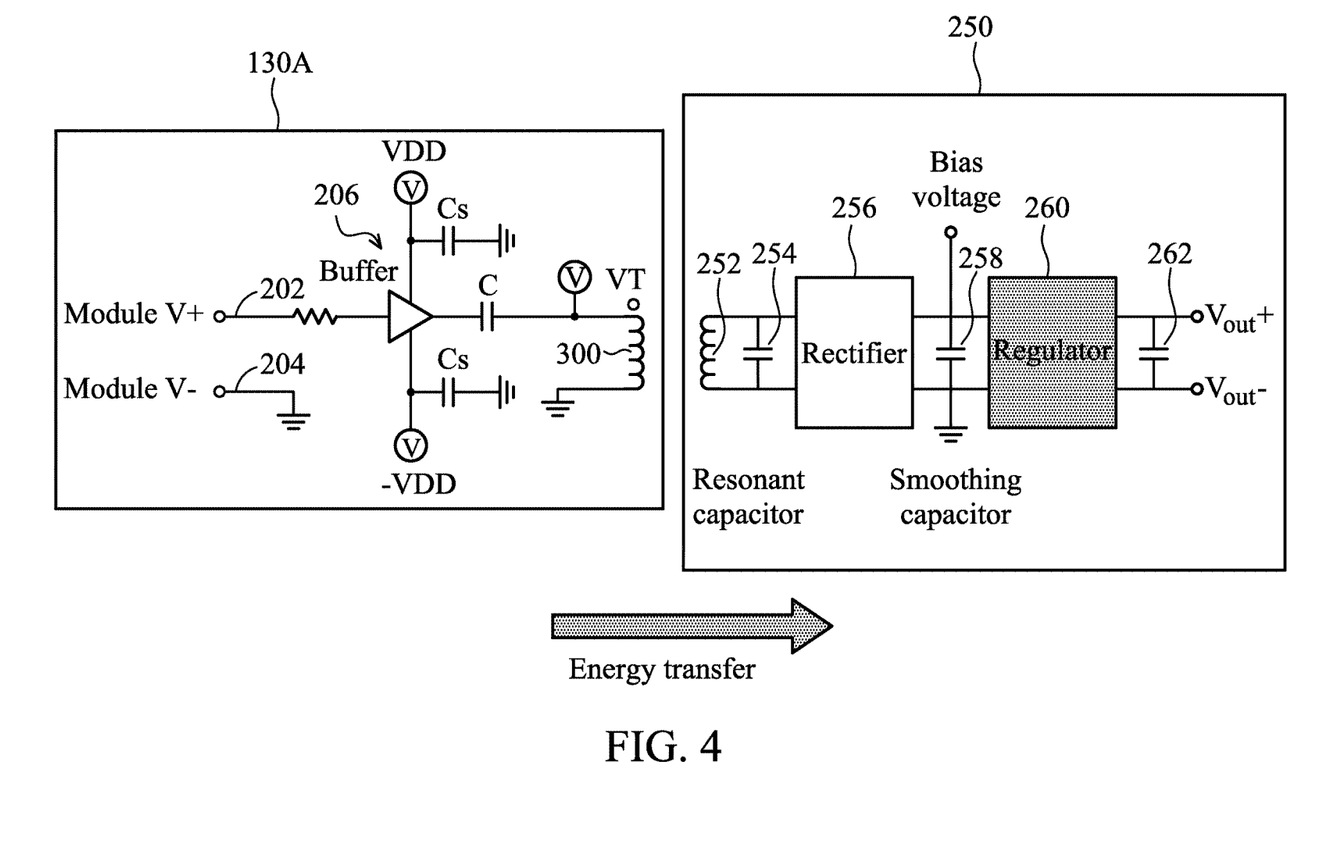
FIG. 4 illustrates a RF power transmitter and receiver system, in accordance with some embodiments.

FIG. 4 illustrates in more detail one embodiment of the RF transmitter 200 shown in the power generation region 130A of FIG. 3. FIG. 4 also illustrates a corresponding wireless RF power receiver 250, which may be external to the solar module. It is estimated the energy transfer rate of this configuration is around 95% efficient. The RF transmitter 200 can take any number of forms, and only one such embodiment is shown in FIG. 4. The RF transmitter 200 includes positive and negative leads 202, 204 corresponding to the positive and negative leads of the power generation region. The positive lead is coupled to a RC circuit 206 which is in turn coupled to a transmission coil 300.

External to the solar module 100 is the corresponding RF receiver, such as RF receiver 250. As with the transmitter, the RF receiver can take any number of forms, and only one such example is illustrated in FIG. 4. The RF receiver 250 of FIG. 4 includes a coil 252 for receiving RF energy from the transmitter coil 300, a resonant capacitor 254, rectifier 256, smoothing capacitor 258, regulator 260, and output capacitor 262 coupled between positive and negative output nodes. RF power transmitters and receivers are available commercially from, for example, Fa Da Tong Technology Co., Ltd., Chung-Ho City, Taipei County, Taiwan. For example, this company provides the A1-EVB-TX RF transmitter and the β3-40W-RX-EVB RF receiver products.

Figure 5:
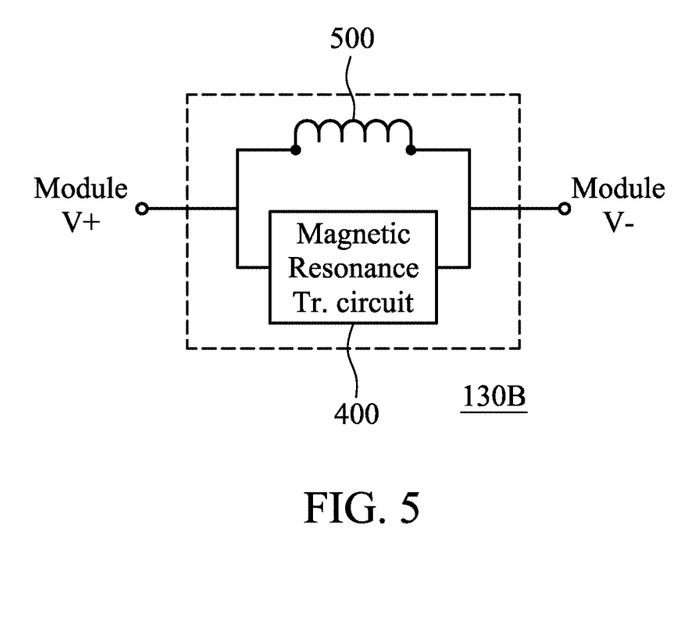
FIG. 5 illustrates a magnetic resonance or inductance power transfer region of a solar module, in accordance with some embodiments.

FIG. 5 illustrates another embodiment of a power transfer region 130B. In this embodiment, power is transferred from the solar module 100 via magnetic or inductive resonance coupling. This embodiment includes an magnetic resonance transmitter circuit 400 coupled between the positive and negative power leads of the solar module 100 and a RF coil 500 coupled to the magnetic resonance transmitter circuit 400. In these systems, oscillating current in an external coil of wire generates a changing magnetic field which induces a voltage inside a receiving coil. The current resultant from this voltage can charge a battery and/or power a device directly.

Figure 6:
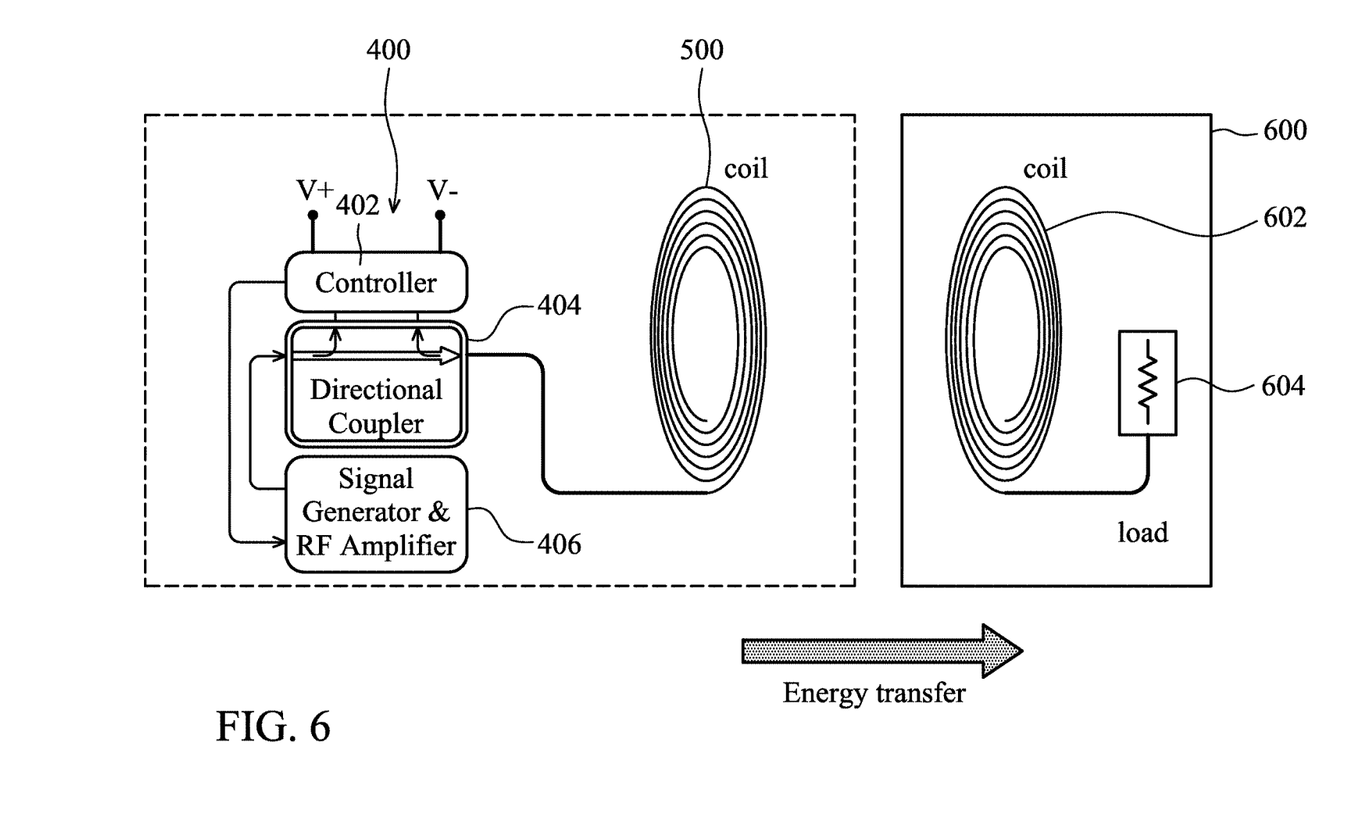
FIG. 6 illustrates a magnetic resonance or inductance power transmitter and receiver system, in a accordance with some embodiments.

FIG. 6 illustrates in more detail one embodiment of the magnetic resonance transmitter circuit 400 shown in the power generation region 130B of FIG. 5. FIG. 6 also illustrates a corresponding wireless magnetic resonance receiver circuit 600, which may be external to the solar module but sufficiently proximate to allow for magnetic resonance coupling between the transmitter coil 500 and the receiving coil 602. The magnetic resonance transmitter circuit 400 can take any number of forms, and only one such example is shown in FIG. 6. The transmitter 400 includes a controller 402, directional coupler 404, and signal generator and RF amplifier 406. An output of the directional coupler 404 is coupled to the coil 500.

External to the solar module 100 is the corresponding magnetic resonance receiver, such as receiver 600. As with the transmitter, the receiver can take any number of forms, and only one such example is illustrated in FIG. 6. The receiver 600 of FIG. 6 includes a coil 602 and a load 604. It is estimated the energy transfer rate of this configuration is around 95-98% efficient. Wireless magnetic resonance power transmitters and receivers are available commercially from, for example, Sunrom Technologies of Gujarat, India. For example, this company provides the wireless power transfer and charging module model 1300.

In various embodiments, the power transfer region 130 can include various IC chips in a transmitter module for performing the transmitter functions of the embodiments described above. The module may or may not be mounted on a dedicated PCB. The transmitter coil may be a wound wire coil or other coil connected to the transmitter or, alternatively, the coil can be fabricated along with the solar cells by laser scribing or laser exposure as discussed in more detail below in connection with FIG. 8. In embodiments, the coil is formed within a metal interconnect layer fabricated as part of the solar module interconnection layer(s).

Figure 7:
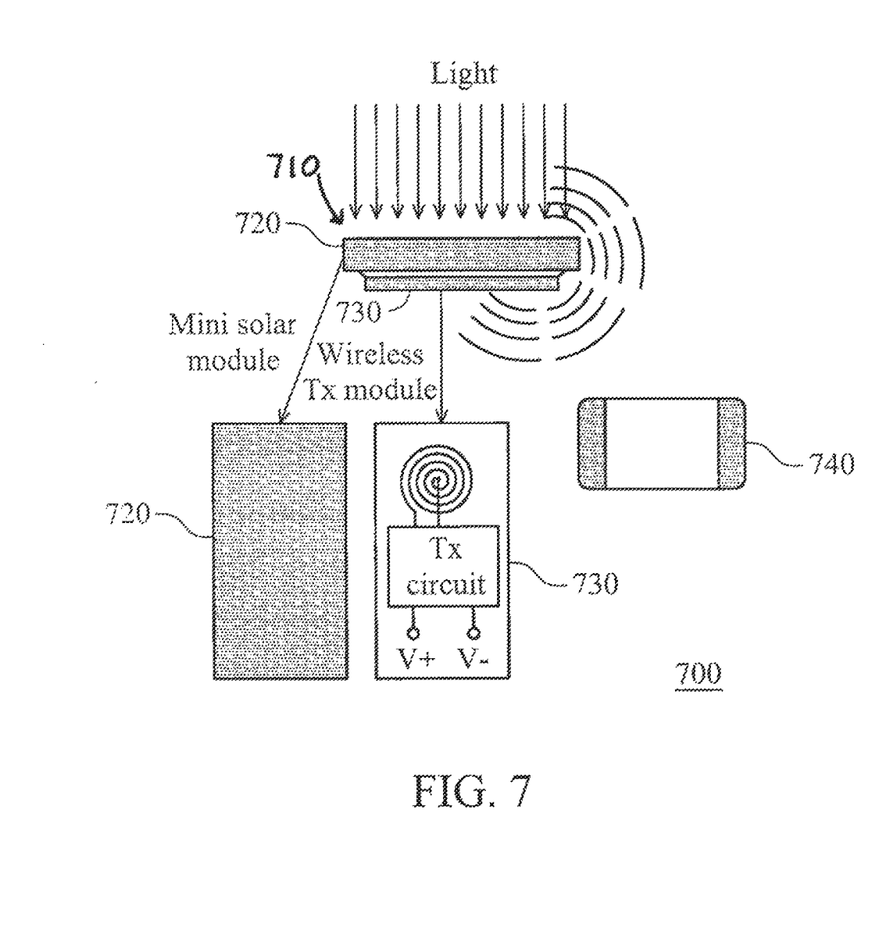
FIG. 7 illustrates a system including a wireless power generation and transmission unit and a device to which power is wirelessly transmitted.

FIG. 7 illustrates an implementation of the wireless power transfer techniques described herein for powering or recharging a device, such as a mobile device. The system 700 includes a mini solar module 710, without a junction box and connector, as described above in connection with FIGS. 2A and 2B. The solar module includes a mini solar panel or array 720 and a RF or magnetic resonance power transmission module 730 as described above. In embodiments, the solar module may be small enough to be portable, such as the size of a tablet device or even pocket-sized. The system also includes a device that is to be powered or recharged, such as a mobile device 740. The device 740 is provided with a power receiver module as described above for receiving power from the RF/magnetic resonance wireless transmitter module 730. In the case of magnetic resonance or inductive coupling, it may be preferred for the mobile device to have an exposed or deployable coil. This system allows for on-the-go, untethered recharging of the mobile device 740. Of course, the mobile device may be a tablet, cellular phone, notebook, e-book, gaming device or any other device where wireless power transfer for charging or operation would be desirable.

Figure 8:
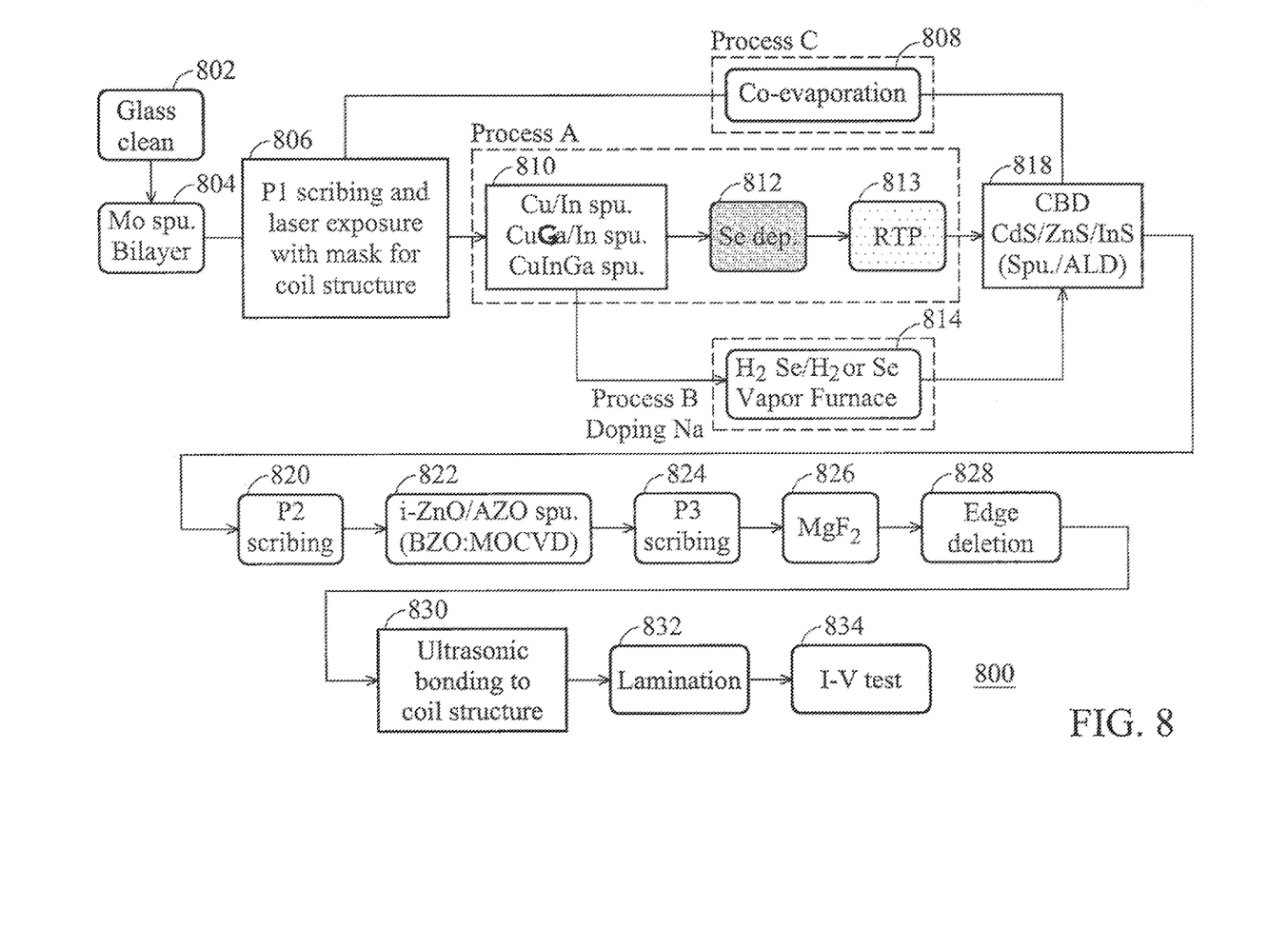
FIG. 8 illustrates a CIGS thin film solar module manufacturing method with steps for fabricating an embedded coil for power transmission from the solar module.

FIG. 8 illustrates an embodiment of a method 800 of manufacturing a photovoltaic device having a thin film CIGS absorption layer with an embedded coil for power transmission from the solar module. Except for the coil formation steps, this process is described in copending and commonly assigned U.S. patent application Ser. No. 13/967,549 filed Aug. 15, 2013, entitled "Method of Forming Chalcopyrite Thin Film Solar Cell", the entirety of which is hereby incorporated by reference herein. Some embodiments of the method include the following steps:

At step 802, a glass substrate is provided and cleaned.

At step 804, a back contact layer (i.e., containing a V− contact and V+ contact), such as a layer of Mo, is deposited on the cleaned glass substrate by sputtering.

At step 806, interconnections (i.e., P1 line) for the solar module are formed. For example, a laser can be used to cut the Mo layer. This step can also be used to form a coil structure (described above) along with the interconnections of the solar module, i.e., in the interconnection layer.

A Cu—In—Ga—Se layer is prepared by, for example: co-evaporating Cu, In, Ga and Se onto the substrate (step 808); sputtering Cu, In, CuGa and/or CuInGa onto the substrate (step 810) followed by evaporating Se onto the substrate (step 812) followed by rapid thermal processing (RTP) (step 813); or sputtering Cu, In, CuGa, and/or CuInGa while evaporating Se (step 814) and optionally doping with Na.

Other processes for forming a CIGS film may also be utilized.

At step 818, a buffer layer of CdS or ZnS or InS is deposited on top of the CIGS absorber layer, such as by a chemical bath deposition step.

At step 820, additional interconnects (P2 line) for the solar module are formed. For example, a mechanical scribing operation can be performed to cut the CIGS/CdS layers.

At step 822, a TCO (transparent conducting oxide (i.e., optically transparent and electrically conductive)) layer is deposited. In embodiments, the TCO may be a tin-doped indium oxide, boron doped zinc oxide, or aluminum doped zinc oxide. This layer connects to the V− contact formed in the Mo layer.

At step 824, additional interconnects (P3 line) for the solar module are formed. For example, a mechanical scribing operation can be performed to cut the TCO/CdS/CIGS layers.

At step 826, an optional anti-reflection layer is formed over the TCO layer, such as by evaporating MgF2.

At step 828, edges are deleted using a laser.

At step 830, a bonding technique, such as ultrasonic bonding, can be used to bond a transmitter IC to the coil and solar module positive and negative contact leads.

At step 832, a lamination procedure is performed to provide the device with a front glass layer and form the solar module.

Finally, at step 834, the solar cell can be tested, such as using an I-V test.

If the solar module is a Si solar module, such solar cells typically use a metal film as the back contact. The transmission coil can easily be integrated into this back contact using techniques familiar to those in the art of fabricating such devices.

A solar module as described herein with wireless power transmission provides both improved reliability and potential costs reductions. For example, use of wireless power transmission eliminates the need for the junction box and connector to transfer power from the solar module. This approach eliminates one source of mechanical and electrical failure. The improved lifetime of the solar module also provides costs savings. There are also costs savings associated with eliminating the junction box and connector.

In one embodiment of a solar module described herein, the solar module includes a solar panel and a wireless power transmission module coupled to the solar panel for transmitting power generated by the solar panel wirelessly.

In one embodiment of a system described herein, the system includes a solar module comprising a solar panel and a wireless power transmitter electrically coupled to the solar panel for transmitting power generated by the solar panel wirelessly. The system also includes a device including a wireless power receiver configured for receiving power transmitted by the wireless power transmitter of the solar module.

In another embodiment of a solar module, the solar module includes a thin film CIGS solar panel; a RF or magnetic resonance wireless power transmitter circuit coupled to the solar panel for transmitting power generated by the solar panel wirelessly; and a coil integrated into the solar panel and electrically coupled to the wireless power transmitter circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A solar module comprising:
   a solar panel, the solar panel comprising one or more solar cells formed as an integrated circuit structure having plurality of layers, the plurality of layers including a substrate, a conductive back contact layer formed directly on a bottom surface of the substrate and having conductive interconnects for the one or more solar cells formed therein, and an absorber layer formed over a top surface of the substrate, wherein the conductive back contact layer includes first and second contacts of the solar panel; and
   a wireless power transmission module coupled to the solar panel for transmitting power generated by the solar panel, and provided at the first and second contacts, wirelessly,
   wherein the wireless power transmission module comprises a wireless transmission coil formed within the conductive back contact layer of the integrated circuit structure and a transmitter integrated circuit chip bonded directly to the conductive back contact layer to electrically connect an output of the transmitter integrated circuit chip to the wireless transmission coil and an input of the transmitter integrated circuit chip to the first and second contacts of the solar panel, wherein power generated by the solar panel is coupled through the transmitter integrated circuit chip to the wireless transmission coil for wireless transmission.

2. The solar module of claim 1, wherein the wireless power transmission module is a RF wireless power transmission module.

3. The solar module of claim 2, wherein the RF wireless power transmission module comprises an RC circuit coupled to the wireless transmission coil.

4. The solar module of claim 1, wherein the wireless power transmission module is a magnetic resonance wireless power transmission module.

5. The solar module of claim 4, wherein the magnetic resonance wireless power transmission module comprises a magnetic resonance circuit.

6. The solar module of claim 1, wherein the coil is integrated into the solar panel during fabrication of the one or more solar cells, the coil being a feature cut into and defined from the back contact layer.

7. The solar module of claim 1, wherein the solar panel comprises one or more silicon solar cells.

8. The solar module of claim 1, wherein the solar panel comprises one or more thin film solar cells.

9. The solar module of claim 1, wherein the wireless power transmitter circuit comprises a transmitter integrated circuit chip bonded to the solar panel to make electrical contact with the wireless transmission coil and the first and second contacts.

10. A system comprising:
    a pocket sized compact portable solar module comprising a solar panel and a wireless power transmitter electrically coupled to the solar panel for transmitting power generated by the solar panel wirelessly, wherein the solar panel comprises one or more solar cells formed as an integrated circuit structure having plurality of layers, the plurality of layers including a substrate, a conductive back contact layer formed directly on a bottom surface of the substrate and having conductive interconnects for the one or more solar cells formed therein, and an absorber layer formed over a top surface of the substrate, and wherein the wireless power transmitter comprises a wireless transmission coil formed within the conductive back contact layer of the integrated circuit structure; and
    a mobile electronic device comprising a wireless power receiver and a wireless receiving coil integrated therewith configured for receiving power transmitted by the wireless power transmitter of the solar module,
    wherein the conductive back contact layer includes first and second contacts of the solar panel,
    wherein power generated by the solar panel is provided at the first and second contacts,
    wherein the wireless power transmitter comprises a transmitter integrated circuit chip bonded directly to the conductive back contact layer to electrically connect an output of the transmitter integrated circuit chip to the wireless transmission coil and an input of the transmitter integrated circuit chip to the first and second contacts of the solar panel, wherein power generated by the solar panel is coupled through the transmitter integrated circuit chip to the wireless transmission coil for wireless transmission.

11. The system of claim 10, wherein the mobile electronic device is selected from the group consisting of a tablet computer device, cellular phone, notebook computer, e-book, and a portable gaming device.

12. The system of claim 10, wherein the wireless power transmitter and wireless power receiver are configured for transfer of power by RF.

13. The system of claim 10, wherein the wireless power transmitter and wireless power receiver are configured to transfer power by magnetic resonance.

14. The system of claim 10, wherein the coil is integrated into the solar panel during fabrication of the one or more solar cells, the coil being a feature cut into and defined from the back contact layer.

15. The system of claim 10, wherein the solar panel comprises one or more thin film solar cells.

16. A solar module comprising:
- a solar panel comprising an integrated circuit structure comprising one or more chalcopyrite thin film solar cells, the solar panel having first and second contacts;
- a RF or magnetic resonance wireless power transmitter circuit coupled to the solar panel for transmitting power generated by the one or more chalcopyrite thin film solar cells, and provided at the first and second contacts, wirelessly; and
- a wireless transmission coil integrated into the solar panel and electrically coupled to the wireless power transmitter circuit, wherein the integrated circuit structure has a plurality of layers, the plurality of layers including a substrate, a conductive back contact layer formed directly on a bottom surface of the substrate and having conductive interconnects for the one or more chalcopyrite thin film solar cells formed therein, and a chalcopyrite thin film absorber layer formed over a top surface of the substrate, and wherein the wireless transmission coil is formed within the conductive back contact layer of the integrated circuit structure, wherein the wireless power transmitter circuit includes a transmitter integrated circuit chip bonded directly to the conductive back contact layer to electrically connect an output of the transmitter integrated circuit chip to the wireless transmission coil and an input of the transmitter integrated circuit chip to first and second contacts of the solar panel, wherein power generated by the solar panel is coupled through the transmitter integrated circuit chip to the wireless transmission coil for wireless transmission.

* * * * *